(12) United States Patent
Mann

(10) Patent No.: US 11,444,563 B2
(45) Date of Patent: Sep. 13, 2022

(54) MOTOR DRIVE

(71) Applicant: Hamilton Sundstrand Corporation, Charlotte, NC (US)

(72) Inventor: Jaspreet Kaur Mann, Solihull (GB)

(73) Assignee: GOODRICH CONTROL SYSTEMS, Solihull (GB)

(*) Notice: Subject to any disclaimer, the term of this patent is extended or adjusted under 35 U.S.C. 154(b) by 61 days.

(21) Appl. No.: 17/146,600

(22) Filed: Jan. 12, 2021

(65) Prior Publication Data

US 2021/0288601 A1  Sep. 16, 2021

(30) Foreign Application Priority Data

Mar. 13, 2020 (EP) .................................. 20275058

(51) Int. Cl.
*H02H 7/08* (2006.01)
*H02P 23/00* (2016.01)
*H02P 27/06* (2006.01)

(52) U.S. Cl.
CPC .......... *H02P 23/0022* (2013.01); *H02P 27/06* (2013.01); *H02P 2201/03* (2013.01)

(58) Field of Classification Search
CPC .. H02P 23/0022; H02P 27/06; H02P 2201/03; G01R 27/2605; G01R 31/64
See application file for complete search history.

(56) References Cited

U.S. PATENT DOCUMENTS 6,697,270 B1* 2/2004 Kalman ............... H02P 9/102
363/51
8,415,914 B2* 4/2013 Baker ................. H02P 23/04
318/702
8,796,982 B2* 8/2014 Li ..................... H02P 29/032
318/722
9,154,044 B2 10/2015 Choi et al.
10,541,626 B1* 1/2020 Lamb ............... H02M 7/53873
(Continued)

FOREIGN PATENT DOCUMENTS

EP    3223023 A1    9/2017
EP    3223023 A9    9/2017

OTHER PUBLICATIONS

Extended European Search Report for International Application No. 20275058.4 dated Oct. 5, 2020, 41 pages.
(Continued)

*Primary Examiner* — Muhammad S Islam
(74) *Attorney, Agent, or Firm* — Cantor Colburn LLP

(57) ABSTRACT

A motor drive comprises a rectifier arranged to receive an externally supplied AC voltage and to generate a DC bus voltage. An inverter is arranged to receive the DC bus voltage and to generate an AC output voltage for supply to an external load. A DC bus portion is connected between the rectifier and the inverter. The DC bus comprises first and second conductors, wherein an inductor is connected in series along the first conductor between the rectifier and the inverter. A DC link capacitor is connected in parallel between the conductors. A controller is arranged to supply a plurality of perturbation signals at a first node between the rectifier circuit portion and the DC bus portion, to measure a respective response signal at a second node between the DC bus and the inverter and is is arranged to generate a parameterised model of a transfer function of the DC.

17 Claims, 2 Drawing Sheets

(56) References Cited

U.S. PATENT DOCUMENTS

| | | | | |
|---|---|---|---|---|
| 2013/0155729 A1* | 6/2013 | Lee | ............... | H02P 29/032 |
| | | | | 363/37 |
| 2013/0176753 A1* | 7/2013 | Swamy | ............... | H02M 1/4216 |
| | | | | 363/37 |
| 2013/0181654 A1* | 7/2013 | Rozman | ............. | H02M 5/4585 |
| | | | | 318/721 |
| 2014/0225545 A1* | 8/2014 | Becerra | ................. | H02P 6/14 |
| | | | | 318/400.26 |
| 2017/0302209 A1* | 10/2017 | Royak | ................. | H02P 21/24 |
| 2017/0336463 A1 | 11/2017 | Makdessi et al. | | |
| 2019/0379297 A1* | 12/2019 | Agirman | ............... | H02M 7/493 |

OTHER PUBLICATIONS

Oukaour A et al., "Supercapacitors Aging Diagnosis Using Least Square Algorithm", Microelectronics and Reliability, vol. 53, No. 9, Nov. 2013, 5 pages.

Tyagi Tushar et al., "Frequency Estimation 3,5,6 Techniques in Capacitance-to-Frequency Conversion Measurement", Review of Scientific Instruments, AIP, Melville, NY, US, vol. 91, No. 1, Jan. 13, 2020, 22 pages.

\* cited by examiner

MOTOR DRIVE

FOREIGN PRIORITY

This application claims priority to European Patent Application No. 20275058.4 filed Mar. 13, 2020, the entire contents of which is incorporated herein by reference.

TECHNICAL FIELD

This disclosure relates to a motor drive arranged to monitor degradation of an internal capacitor, in particular the capacitance of a DC link capacitor of the motor drive.

BACKGROUND ART

Typical industrial motor drives include a front-end rectifier arranged to convert an externally supplied AC voltage to a rectified DC voltage, and a power inverter that converts this rectified DC voltage to an AC voltage suitable for supply to a motor. The motor may, in turn, drive an actuator. Such motor drives are used in a wide variety of applications, however some such motor drives are particularly applicable to aerospace applications.

The front-end rectifier and the power inverter are generally separated by a DC bus, where the DC bus includes a DC link capacitor. The DC link capacitor is typically connected in parallel between the positive and negative conductors of the DC bus and serves to smooth the DC voltage output of the front-end rectifier. The DC link capacitor also protects upstream circuits from the transient response of downstream circuits.

Typically, the DC link capacitor value is selected to optimise the stability of the DC voltage across the bus. However, the capacitance of the DC link capacitor can change over time. One cause of this change in capacitance is a slow aging mechanism which leads to the capacitance decreasing by a few percentage points over a relatively long period of time, e.g. over a few years. A further cause is a failure mechanism involving dielectric breakdown followed by capacitor self-healing, which can cause sudden and significant drops in the capacitance.

In motor drives for aerospace applications, the weight and volume of the motor drive is an important consideration, where the weight and volume are ideally minimal. The DC link capacitor is generally one of the largest components of the motor drive by volume. In order to minimise weight and volume, the minimal capacitance component possible is typically selected, however this generally means that there is little overvoltage margin and little current ripple margin in the design which makes premature aging of the device more likely.

The present disclosure is concerned with providing an improved motor drive capable of detecting capacitance changes such that replacement or maintenance can be carried out at the appropriate time.

SUMMARY OF THE DISCLOSURE

In accordance with a first aspect, the present disclosure provides a motor drive comprising: a rectifier circuit portion arranged to receive an externally supplied AC voltage and to generate a DC bus voltage therefrom; an inverter circuit portion arranged to receive the DC bus voltage and to generate an AC output voltage therefrom for supply to an external load; a DC bus portion connected between said rectifier and inverter circuit portions, said DC bus portion comprising first and second conductors, wherein an inductor is connected in series along the first conductor between said rectifier and inverter circuit portions, and wherein a DC link capacitor is connected in parallel between the first and second conductors; and a controller arranged to supply a plurality of perturbation signals at a first node between the rectifier circuit portion and the DC bus portion, and to measure a respective response signal, for each perturbation signal, at a second node between the DC bus portion and the inverter circuit portion; wherein the controller is arranged to generate a parameterised model of a transfer function of the DC bus portion from said perturbation and response signals and to extract an estimated capacitance of the DC link capacitor from said parameterised model.

The first aspect of the disclosure extends to a method of estimating a capacitance of a DC link capacitor within a DC bus portion of a motor drive, wherein the DC bus portion comprises an inductor and the DC link capacitor, the method comprising: supplying a plurality of perturbation signals at a first node between a rectifier circuit portion and the DC bus portion; for each perturbation signal, measuring a respective response signal at a second node between the DC bus portion and the inverter circuit portion; generating a parameterised model of a transfer function of the DC bus portion from said perturbation and response signals; and extracting an estimated capacitance of the DC link capacitor from said parameterised model. The motor drive may comprise the motor drive of the first aspect of the disclosure outlined hereinabove.

The first aspect of the disclosure also extends to a non-transitory computer-readable medium comprising instructions that, when executed by a processor, cause the processor to carry out a method of estimating a capacitance of a DC link capacitor within a DC bus portion of a motor drive, wherein the DC bus portion comprises an inductor and the DC link capacitor, the method comprising: supplying a plurality of perturbation signals, each having a respective frequency, at a first node between a rectifier circuit portion and the DC bus portion; for each perturbation signal, measuring a respective response signal at a second node between the DC bus portion and the inverter circuit portion; generating a parameterised model of a transfer function of the DC bus portion from said perturbation and response signals; and extracting an estimated capacitance of the DC link capacitor from said parameterised model. The motor drive may comprise the motor drive of the first aspect of the disclosure outlined hereinabove.

Thus it will be appreciated that examples of the present disclosure provide an improved motor drive system and method of operating the same in which the capacitance of the DC link capacitor is determined by generating a parameterised model of the transfer function of the DC bus. Perturbation signals are fed into the input of the DC bus and the output is monitored so as to observe the response of the effective resonant circuit constructed from the inductor and DC link capacitor, often referred to in the art as an 'LC resonant circuit' or 'LC resonator'. The perturbation and response signals are then compared in order to determine the transfer function in a manner known in the art per se.

The controller may be a hardware device or may be defined in software, or a mix of these. In some examples, the controller comprises a start-up built-in test (SBIT) controller. Thus the capacitance measurement process may be carried out during a start-up procedure of the motor drive system.

Different types of signals may be used as perturbation signals. For example, the perturbation signals may comprise white noise signals or pulse signals (e.g. each perturbation signal may comprise an impulse or 'spike'). However, in some examples, the plurality of perturbation signals comprise sinusoidal signals. In a set of such embodiments, each of the perturbation signals comprises a sinusoidal signal having a different frequency. The frequencies of these sinusoidal perturbation signals may be selected such that they are all within a frequency window (i.e. a range of frequencies) that includes a nominal resonant frequency of the LC circuit including the inductor and DC link capacitor. Those skilled in the art will appreciate that the term 'nominal resonant frequency' as used herein means the resonant frequency of the LC resonator that would be expected assuming the DC link capacitor had its designed capacitance (i.e. without any degradation due to aging or other effects).

The frequencies of the perturbation signals may be a power of two, i.e. $2^n$ where n is a non-zero integer. Closely matching the frequencies of the perturbation signals to powers of two may simplify computation of the transfer function.

The magnitude of the perturbation signals is, in some examples, low enough so as not to disturb normal operation of the load driven by the motor drive, e.g. the motor and/or actuator connected downstream of the motor drive. For example, an amplitude of each perturbation signal may be between approximately 10 V and 30 V, and may in some examples be approximately 10 V. In some examples, each of the plurality of perturbation signals is supplied at an initial magnitude, wherein the controller is arranged to adjust the respective magnitude of each of the perturbation signals in response to the measured response signals. The adjusted magnitude values may be stored, e.g. in configuration settings in a memory, such that a test at a subsequent time may be carried out using these calibrated magnitudes. The initial magnitude may be, for example, 10 V.

The number of perturbation signals supplied may be determined based on the computational power of the controller. In some examples, fewer than twenty perturbation signals may be used, for example fewer than fifteen, and in some examples ten or fewer perturbation signals may be used.

Different methods may be used to measure the response signals. The controller may, in some examples, be arranged to carry out Frequency Response Function (FRF) measurements. In some examples, the controller uses IQ demodulation. Those skilled in the art will appreciate that 'IQ demodulation' is a technique for extracting in-phase (I) and quadrature (Q) signals, in which the response signals are multiplied by a cosine signal and a sine signal (i.e. two sinusoidal signals having a 90° or $\pi/2$ phase difference) to generate the I and Q signals. The controller may, in some examples, have a generation function that generates said cosine and sine signals. Thus the controller may generate in-phase and quadrature sequences for each perturbation signal and to determine in-phase and quadrature sequences for each respective response signal, e.g. each perturbation frequency. These I and Q sequences may be used by the controller to compute the transfer function of the DC bus portion.

There are a number of different parameterised models and corresponding model generators that could be used in accordance with examples of the disclosure. In some examples, the parametrised model comprises a ratio of frequency-dependent complex polynomials.

The controller may, in some examples, be arranged to minimise an error between the parametrised model and the transfer function. This may, for example, comprise summing the residual sum of squares and equating the partial derivative of the resulting sum with respect to the coefficients to zero.

The non-linear cost function can be minimised using non-linear optimisation techniques known in the art per se. However, such techniques typically depend on the initial values set. As a result, a simple least squares estimator may not be able to identify the non-linear function expressed in the form of a rational fraction. As such, in some examples, the controller is arranged to linearise the cost function. In some examples, the controller modifies the cost function using a weighting function. This weighting function may, in some embodiments comprise the denominator $D(s_k)$ of the ratio of frequency-dependent complex polynomials.

In order to fit the parametrised model to the measured transfer function, the controller may, in some examples, carry out an iterative computation process. For example, the controller may carry out an iterative algorithm which minimises the cost function by constraining one of the coefficients to a constant and iteratively solving for the remaining coefficients.

It has been appreciated, however, that the absolute error function may still result in an erroneous estimate of the system model because the measured transfer function incorporates measurement errors and system uncertainties. As such, in some examples, the controller is arranged to determine a relative error function. A relative error function advantageously defines how large the error (i.e. the difference between the parameterised model and the non-parameterised measured transfer function) is in relation to the measured value, rather than how large the error itself is (i.e. its absolute value). A modified cost function may minimise the relative error between the measured transfer function and the parameterised model generated by the controller.

In a set of examples, the relative error criterion, combined with a weighing function and iterative process as outlined above may yield a best-fit for the system model. The estimated best-fit model defined in the form of a Laplace rational fraction may advantageously enable extracting the model coefficients and the components values. For example, if the best-fit model matches a second-order Laplace rational fraction of the system, comparison of the extracted and actual circuit component values may provide an estimate of degradation or anomalies in the system and/or electronic components.

BRIEF DESCRIPTION OF THE DRAWINGS

Certain examples of the present disclosure will now be described with reference to the accompanying drawings, in which.

DETAILED DESCRIPTION

Figure 1:
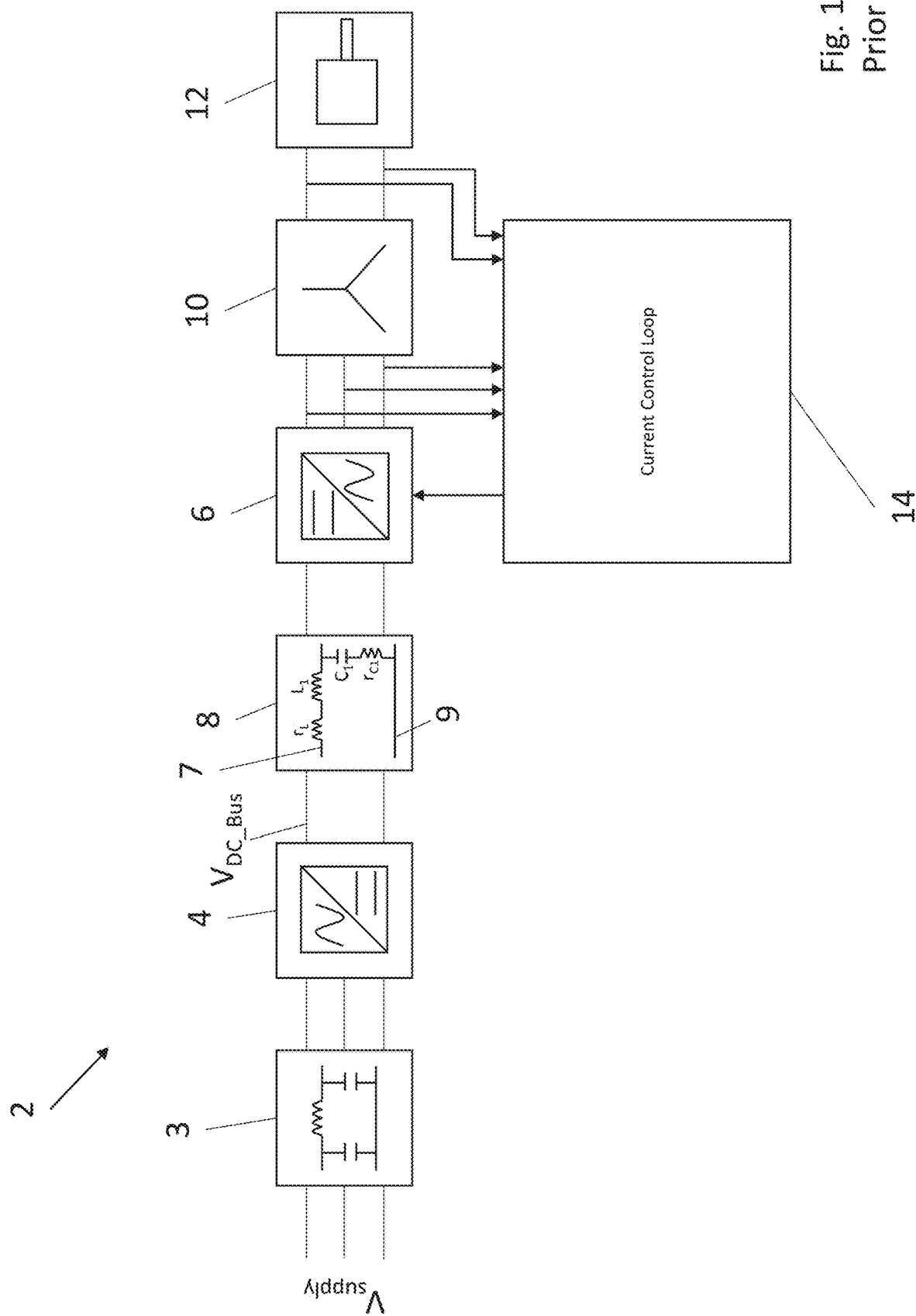
FIG. 1 is a schematic diagram of a prior art motor drive system.

FIG. 1 is a schematic diagram of a prior art motor drive system 2. The motor drive system 2 includes a front-end rectifier 4 and a power inverter 6, which are connected by a DC bus 8.

The front-end rectifier 4 is arranged to receive an externally supplied AC voltage $V_{supply}$, which in this example is a three-phase AC input voltage, via an electromagnetic compatibility (EMC) filter 3. The EMC filter 3 removes electromagnetic noise from the externally supplied AC voltage $V_{supply}$ and the conducted emissions from the system that can affect the external AC voltage.

The rectifier 4 converts this AC voltage $V_{supply}$ to a DC bus voltage $V_{DC\_Bus}$ which is transferred to the inverter 6 across the DC bus 8, the details of which are discussed in more detail below. It will be appreciated that other arrangements are possible, e.g. in which the rectifier 4 receives a single-phase input. Thus the rectifier 4 is an AC-to-DC converter (ADC).

The inverter 6 takes the DC bus voltage $V_{DC\_Bus}$ and converts it back to an AC output voltage $V_{out}$ suitable for supply to the connected load. In this example, the inverter 6 supplies the output voltage $V_{out}$ to a motor 10, which in turn is arranged to drive an actuator 12. In this example, the output voltage $V_{out}$ provided to the motor 10 is a three-phase voltage suitable to drive the three-phase motor 10. It will be appreciated that other arrangements are possible, e.g. in which the inverter 6 produces a single-phase output. Thus the inverter 6 is a DC-to-AC converter (DAC).

The DC bus portion 8 is constructed from an inductor $L_1$ along the positive conductor 7 (i.e. rail) of the DC bus portion 8, where this inductor $L_1$ is shown in series with its equivalent resistance $r_L$. A DC link capacitor $C_1$ is connected in parallel between the positive conductor 7 and the negative conductor 9, where the equivalent resistance $r_{C1}$ is shown in series with the DC link capacitor $C_1$. This DC link capacitor $C_1$ smooths the DC voltage output produced by the front-end rectifier, i.e. the DC bus voltage $V_{DC\_Bus}$. The DC link capacitor $C_1$ also protects upstream circuits from the transient response of downstream circuits.

A current control loop 14 serves to control the inverter 6 so as to provide the necessary amount of current to the motor 10 for proper driving of the actuator 12 to a desired set point. This current control loop 14 may use any suitable control mechanism, known in the art per se, such as proportional-integral (PI), closed loop control.

Over time, the capacitance of the DC link capacitor $C_1$ changes due to aging. The capacitance of the DC link capacitor $C_1$ may also change in response to a 'shock', e.g. due to a large voltage spike.

Figure 2:
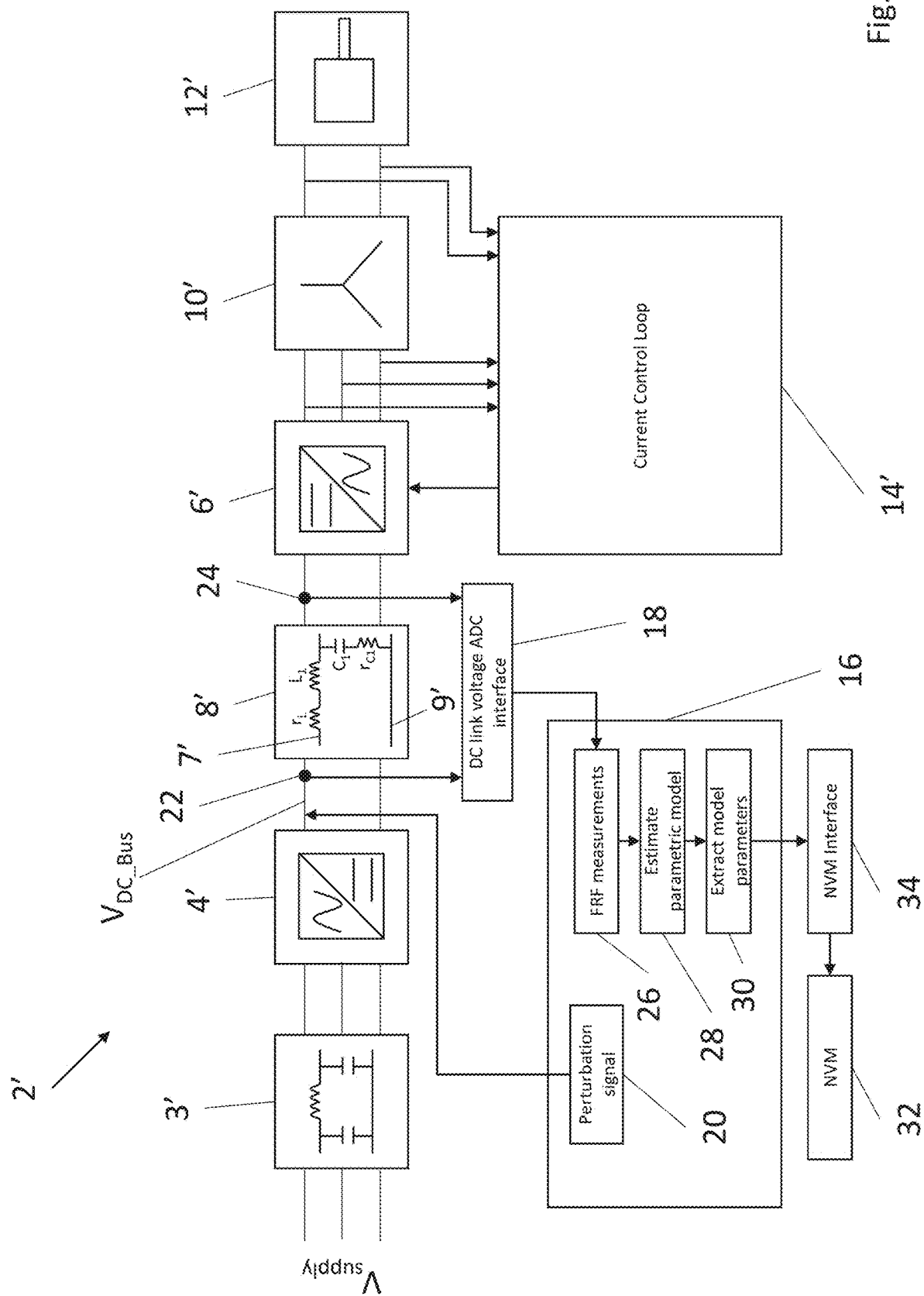
FIG. 2 is a schematic diagram of a motor drive system in accordance with an example of the present disclosure.

FIG. 2 is a schematic diagram of a motor drive system 2' in accordance with an example of the present disclosure, where like reference numerals appended with a prime symbol (') denote like components to those described above with reference to the prior art motor drive system 2 of FIG. 1.

In the motor drive system 2' of FIG. 2, an SBIT controller 16 is connected across the DC bus portion 8' via a DC link voltage ADC interface 18. As outlined in further details below, the SBIT controller 16 measures the input and output signals of the DC bus portion 8' to determine the transfer function of the DC bus portion 8'.

The SBIT controller 16 is arranged to supply a plurality of perturbation signals 20 at a first node 22 between the rectifier circuit portion 4' and the DC bus portion 8', and to measure a respective response signal, for each perturbation signal, at a second node 24 between the DC bus portion 8' and the inverter circuit portion 6'.

The SBIT controller 16 is arranged to take FRF measurements 26 of the input and output signals associated with the DC bus portion 8' as outlined below. The SBIT controller 16 also generates a parameterised model 28 of the transfer function of the DC bus portion 8' from the perturbation and response signals and to extract an estimated capacitance of the DC link capacitor $C_1$ from the parameterised model.

The in-phase and quadrature response signals $X_I(k)$, $X_Q(k)$ at the input of the DC bus portion 8' (i.e. at the node 22) may be given by Equations 1 and 2 below:

$$X_I(k) = \frac{2}{N}\sum_{n=0}^{N-1} x(n)\sin\left(\frac{2\pi k}{N}n\right)$$

Equation 1: In-Phase Response Signal $X_I(k)$ at the Input of the DC Bus Portion $$X_Q(k) = \frac{2}{N}\sum_{n=0}^{N-1} x(n)\cos\left(\frac{2\pi k}{N}n\right)$$

Equation 2: Quadrature Response Signal $X_Q(k)$ at the Input of the DC Bus Portion
where $X_I(k)$ is the in-phase response signal, $X_Q(k)$ is the quadrature response signal, k is the perturbation frequency, and N is the number of measurement samples.

The in-phase and quadrature response signals at the output of the DC bus portion 8' (i.e. at the node 24), measured via the DC link voltage ADC interface 18, are given by Equations 3 and 4 below:

$$Y_I(k) = \frac{2}{N}\sum_{n=0}^{N-1} y(n)\sin\left(\frac{2\pi k}{N}n\right)$$

Equation 3: In-Phase Response Signal $Y_I(k)$ at the Output of the DC Bus Portion $$Y_Q(k) = \frac{2}{N}\sum_{n=0}^{N-1} y(n)\cos\left(\frac{2\pi k}{N}n\right)$$

Equation 4: Quadrature Response Signal $Y_Q(k)$ at the Output of the DC Bus Portion
where $Y_I(k)$ is the in-phase response signal, $Y_Q(k)$ is the quadrature response signal, k is the perturbation frequency, and N is the number of measurement samples.

The magnitude $|H_{NP}|$ and phase response $\arg(H_{NP}(s_k))$ of the non-parametrised (i.e. measured) transfer function are then given by Equations 5 and 6 respectively:

$$|H_{NP}| = \sqrt{\frac{(Y_I(k))^2 + (Y_Q(k))^2}{(X_I(k))^2 + (X_Q(k))^2}}$$

Equation 5: Magnitude $|H_{NP}|$ of the Non Parametrised Transfer Function $$\arg(H_{NP}(s_k)) = \tan^{-1}\left(\frac{Y_I(k) + jY_Q(k)}{X_I(k) + jX_Q(k)}\right)$$

Equation 6: Phase Response Arg $(H_{NP}(s_k))$ of the Non-Parametrised Transfer Function
where $s_k$ is the complex frequency in the Laplace domain and j is the imaginary unit.

The SBIT controller 16 generates a parametrised model 28, which comprises a ratio of frequency-dependent complex polynomials, in accordance with Equation 7 below:

$$H_P(s_k) = \frac{N(s_k)}{D(s_k)} = \frac{\sum_{k=0}^{n} n_k s^k}{\sum_{k=0}^{d} d_k s^k} = \frac{n_0 + n_1 s + n_2 s^2 + \cdots}{d_0 + d_1 s + d_2 s^2 + \cdots}$$

Equation 7: Parametrised Transfer Function $H_P(s_k)$

The SBIT controller 16 is arranged to minimise an error between the parametrised model and the transfer function by summing the residual sum of squares and equating the partial derivative of the resulting sum with respect to the coefficients to zero. The function for minimising the absolute error is given in Equation 8 below:

$$|\varepsilon_k|^2 = \sum_{k=1}^{F} |H_{NP}(s_k) - H_P(s_k)|^2 = \sum_{k=1}^{F} \left|H_{NP}(s_k) - \frac{N(s_k)}{D(s_k)}\right|^2$$

Equation 8: Function for Minimising Error Between the Non Parameterised Transfer Function $H_{NP}(s_k)$ and the Parameterised Transfer Function $H_P(s_k)$ The non-linear cost function can be minimised using non-linear optimisation techniques known in the art per se. However, such techniques typically depend on the initial values set. As a result, a simple least squares estimator may not be able to identify the non-linear function expressed in the form of a rational fraction. As such, the SBIT controller 16 is arranged to linearise the cost function. In some examples, the SBIT controller 16 modifies the cost function using a weighting function. In this case, the weighting function is the denominator $D(s_k)$ of the ratio of frequency-dependent complex polynomials, as per Equation 9:

$$|\varepsilon'_k \cdot D(s_k)|^2 = \sum_{k=1}^{F} |H_{NP}(s_k) \cdot D(s_k) - N(s_k)|^2$$

Equation 9: Linearised Function for Minimising Error Between the Non-Parameterised Transfer Function $H_{NP}(s_k)$ and the Parameterised Transfer Function $H_P(s_k)$ In order to fit the parametrised model to the measured transfer function, the SBIT controller 16 carries out an iterative computation process which minimises the cost function by constraining one of the coefficients to a constant and iteratively solving for the remaining coefficients. This iterative process may be carried out in accordance with Equation 10:

$$|\varepsilon''_k|^2 = \left|\frac{\varepsilon_k \cdot D(s_k)_i}{D(s_k)_{i-1}}\right|^2 = \sum_{i}\sum_{k=1}^{F}\left|\frac{H_{NP}(s_k) \cdot D(s_k)_i}{D(s_k)_{i-1}} - \frac{N(s_k)_i}{D(s_k)_{i-1}}\right|^2$$

Equation 10: Iterative Computation Function to Minimise Error where i denotes the iteration number. Subsequent iterations of the algorithm may allow $D(s_k)$ to asymptotically approach $D(s_k)_i$ while updating the weighting function and coefficients each iteration. By using $d_0=1$ as an initial starting value, the absolute error (or cost) function may be minimised at all experimental points.

In order to avoid an erroneous estimate of the system due to e.g. measurement errors and/or system uncertainties, the SBIT controller 16 is arranged to determine a relative error function which defines how large the error (i.e. the difference between the parameterised model and the non-parameterised measured transfer function) is in relation to the measured value, rather than how large the error itself is (i.e. its absolute value). This modified cost function, in accordance with Equation 11 below, may minimise the relative error between the measured transfer function and the parameterised model generated by the SBIT controller 16.

$$|\varepsilon'''_k|^2 = \sum_{i}\sum_{k=1}^{F}\left|\frac{H_{NP}(s_k) \cdot D(s_k)_i}{D(s_k)_{i-1} H_{NP}(s_k)} - \frac{N(s_k)_i}{D(s_k)_{i-1} \cdot H_{NP}(s_k)}\right|^2$$

Equation 11: Iterative Computation Function to Minimise Relative Error

The relative error criterion, combined with a weighing function and iterative process as outlined above may yield a best-fit for the system model. The estimated best-fit model defined in the form of a Laplace rational fraction may advantageously enable extracting the model coefficients and the components values. For example, if the best-fit model matches a second-order Laplace rational fraction of the system, comparison of the extracted and actual circuit component values may provide an estimate of degradation or anomalies in the system and/or electronic components.

In order to extract the model parameters 30 from the numerator and denominator terms of the parameterised transfer function $H_P(s_k)$ following the iterative best-fit process outlined above, the following relationships may be used:

$$n_0 = \frac{1}{(R_{Load} + r_L)}$$

$$n_1 = \frac{C_1 \cdot r_{C1}}{R_{Load} + r_L}$$

$$d_0 = 1$$

$$d_1 = \frac{L_1 + C_1 \cdot r_{C1} \cdot r_L + C_1 \cdot R_{Load} \cdot r_L + C_1 \cdot R_{Load} \cdot r_{C1}}{R_{Load} + r_L}$$

$$d_2 = \frac{C_1 \cdot L_1 \cdot r_{C1} + C_1 \cdot L_1 \cdot R_{Load}}{R_{Load} + r_L}$$

where $r_L$ is the DC resistance of the inductor $L_1$ in ohms, $R_{Load}$ is the load resistance in ohms and represents the equivalent load of the inverter 6', $L_1$ is the inductance of the inductor $L_1$ in henrys, $C_1$ is the capacitance of the DC link capacitor $C_1$, and $r_{C1}$ is the equivalent series resistance (ESR) of the DC link capacitor $C_1$ in ohms.

By using the determined values of $n_0$, $n_1$, $d_0$, $d_1$, and $d_2$, and assuming the inductance of the inductor $L_1$ remains constant, the capacitance value of the DC link capacitor $C_1$ can be determined.

This determined capacitance value of the DC link capacitor $C_1$ can then be stored in a non-volatile memory (NVM) 32 via an NVM interface 34. By comparing the determined capacitance values stored in the NVM 32 over time, a determination can be made as to the degradation rate of the DC link capacitor $C_1$ such that pre-emptive maintenance can be scheduled when necessary.

Thus examples of the present disclosure may allow the use of light, small-volume DC link capacitors, the health of which can be advantageously monitored to determine when maintenance is required. While specific examples of the disclosure have been described in detail, it will be appreciated by those skilled in the art that the examples described in detail are not limiting on the scope of the disclosure.

The invention claimed is:

1. A motor drive comprising:
a rectifier circuit portion arranged to receive an externally supplied AC voltage and to generate a DC bus voltage therefrom;
an inverter circuit portion arranged to receive the DC bus voltage and to generate an AC output voltage therefrom for supply to an external load;
a DC bus portion connected between said rectifier and inverter circuit portions, said DC bus portion comprising first and second conductors, wherein an inductor is connected in series along the first conductor between said rectifier and inverter circuit portions, and wherein a DC link capacitor is connected in parallel between the first and second conductors; and
a controller arranged to supply a plurality of perturbation signals at a first node between the rectifier circuit portion and the DC bus portion, and to measure a respective response signal, for each perturbation signal, at a second node between the DC bus portion and the inverter circuit portion;
wherein the controller is arranged to generate a parameterised model of a transfer function of the DC bus portion from said perturbation and response signals and to extract an estimated capacitance of the DC link capacitor from said parameterised model.

2. The motor drive as claimed in claim 1, wherein the plurality of perturbation signals comprise sinusoidal signals, optionally wherein each of the perturbation signals comprises a sinusoidal signal having a different frequency, further optionally wherein the frequencies of the perturbation signals are a power of two.

3. The motor drive as claimed in claim 1, wherein an amplitude of each perturbation signal is less than 30 V.

4. The motor drive as claimed in claim 1, wherein fewer than twenty perturbation signals are used, optionally wherein fewer than fifteen perturbation signals are used, further optionally wherein ten or fewer perturbation signals are used.

5. The motor drive as claimed in claim 1, wherein the controller is arranged to carry out Frequency Response Function (FRF) measurements.

6. The motor drive as claimed in claim 1, wherein the controller uses IQ demodulation, said controller being arranged to generate in-phase and quadrature sequences for each perturbation signal and to determine in-phase and quadrature sequences for each respective response signal.

7. The motor drive as claimed in claim 1, wherein the parametrised model comprises a ratio of frequency-dependent complex polynomials.

8. The motor drive as claimed in claim 1, wherein the controller is arranged to minimise an error between the parametrised model and the transfer function.

9. The motor drive as claimed in claim 8, wherein the controller is arranged to linearise a cost function used to minimise the error between the parametrised model and the transfer function.

10. The motor drive as claimed in claim 9, wherein the controller modifies the cost function using a weighting function.

11. The motor drive as claimed in claim 10, wherein the weighting function comprises the denominator of the ratio of frequency-dependent complex polynomials.

12. The motor drive as claimed in claim 8, wherein the controller is arranged to determine a relative error function.

13. The motor drive as claimed in claim 12, wherein the controller is arranged to minimise the relative error between the measured transfer function and the parameterised model generated by the controller.

14. The motor drive as claimed in claim 1, wherein the controller is arranged to carry out an iterative computation process to fit the parametrised model to the measured transfer function.

15. The motor drive as claimed in claim 1, wherein the controller comprises a start-up built-in test (SBIT) controller.

16. A method of estimating a capacitance of a DC link capacitor within a DC bus portion of a motor drive, wherein the DC bus portion comprises an inductor and the DC link capacitor, the method comprising:
supplying a plurality of perturbation signals at a first node between a rectifier circuit portion and the DC bus portion;
for each perturbation signal, measuring a respective response signal at a second node between the DC bus portion and the inverter circuit portion;
generating a parameterised model of a transfer function of the DC bus portion from said perturbation and response signals; and
extracting an estimated capacitance of the DC link capacitor from said parameterised model.

17. A non-transitory computer-readable medium comprising instructions that, when executed by a processor, cause the processor to carry out a method of estimating a capacitance of a DC link capacitor within a DC bus portion of a motor drive, wherein the DC bus portion comprises an inductor and the DC link capacitor, the method comprising:
supplying a plurality of perturbation signals, each having a respective frequency, at a first node between a rectifier circuit portion and the DC bus portion;
for each perturbation signal, measuring a respective response signal at a second node between the DC bus portion and the inverter circuit portion;
generating a parameterised model of a transfer function of the DC bus portion from said perturbation and response signals; and
extracting an estimated capacitance of the DC link capacitor from said parameterised model.

* * * * *